(12) United States Patent
Zhang

(10) Patent No.: US 6,193,821 B1
(45) Date of Patent: Feb. 27, 2001

(54) FINE GRAIN TANTALUM SPUTTERING TARGET AND FABRICATION PROCESS

(75) Inventor: Hao Zhang, Grove City, OH (US)

(73) Assignee: Tosoh SMD, Inc., Grove City, OH (US)

(*) Notice: Subject to any disclaimer, the term of this patent is extended or adjusted under 35 U.S.C. 154(b) by 0 days.

(21) Appl. No.: 09/353,700

(22) Filed: Jul. 14, 1999

Related U.S. Application Data

(60) Provisional application No. 60/097,153, filed on Aug. 19, 1998.

(51) Int. Cl.[7] .................................................. C22F 1/18
(52) U.S. Cl. ................ 148/668; 148/422; 148/DIG. 158
(58) Field of Search .................................. 148/422, 668, 148/DIG. 158

(56) References Cited

U.S. PATENT DOCUMENTS

| | | |
|---|---|---|
| 1,994,863 | 3/1935 | Nierhaus . |
| 2,064,323 | 12/1936 | Schmidt et al. . |
| 2,080,640 | 5/1937 | Templin . |
| 3,160,479 | 12/1964 | Davenport . |
| 3,250,109 | 5/1966 | Spyridakis . |
| 3,269,167 | 8/1966 | Hertel et al. . |
| 3,335,037 * | 8/1967 | Dunn et al. .......................... 148/668 |
| 3,370,450 | 2/1968 | Scheucher . |
| 3,497,402 * | 2/1970 | Douglass et al. .................... 148/668 |
| 3,791,188 | 2/1974 | Deussen . |
| 3,818,746 | 6/1974 | Fujita . |
| 3,844,155 | 10/1974 | Bew et al. . |
| 4,970,887 | 11/1990 | Lorieux . |
| 5,615,465 | 4/1997 | Broussoux et al. . |

* cited by examiner

Primary Examiner—John Sheehan
Assistant Examiner—Andrew L. Oltmans
(74) Attorney, Agent, or Firm—Biebel & French

(57) ABSTRACT

A process for treating substantially pure tantalum includes plastically deformed a billet, such as by side-forging or side-rolling, to reduce a first dimension of the billet transverse to the centerline, preferably by about 70% to about 85%. The billet is then upset, such as by upset forging or upset rolling, to reduce a second dimension of the billet transverse to the first dimension (for example, a second dimension lying parallel to the centerline), preferably by about 90% to about 99%. In accordance with an especially preferred process, the upsetting of the billet is followed by rolling along a plane normal to the second dimension. It has been found that billets prepared in accordance with the invention have grain sizes no greater than about 25 μm and predominantly <222> textures relative to their rolling planes, so that targets machined from such billets in such a way that their sputtering surfaces correspond with these rolling planes will have the same predominant <222> textures.

29 Claims, 3 Drawing Sheets

FINE GRAIN TANTALUM SPUTTERING TARGET AND FABRICATION PROCESS

PRIOR PROVISIONAL APPLICATION

Applicant claims the benefit of the filing date of Provisional Application Serial No. 60/097,153, filed Aug. 19, 1998.

FIELD OF THE INVENTION

The present invention generally relates to tantalum sputtering targets having predominantly <222> texture and highly uniform grain sizes on the order of 20–25 μm, and to processes for fabricating such targets.

BACKGROUND OF THE INVENTION

Cathodic sputtering is widely used for depositing thin layers or films of materials from sputter targets onto desired substrates. Basically, a cathode assembly including the sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits on the receiving surface of the substrate to form a thin layer or film.

A wide variety of metallic and ceramic materials have been used to form sputter targets for use in the manufacture of electrical components and other industrial products. Tantalum (Ta) sputter targets are used, for example, for forming tantalum or tantalum-nitrogen barrier layers in the metallization of substrates for ultra large-scale integrated circuits.

A sputter target itself is essentially a metal or ceramic plate, the cross-sectional shape and surface contour of which varies with different sputtering applications. It has been found that the microscopic structure of the material comprising the sputter target has a significant impact on, among other performance criteria, the sputtering rate and the uniformity of the film deposited during the sputtering process.

A metallic sputter target typically comprises a plurality of "grains" of a size visible under an optical microscope. Within each grain, the metal atoms align in a crystalline matrix. The orientations of the crystalline matrices in the various grains are referred to as the "textures" of the grains. Where the crystalline matrices of different grains in a metal sample are oriented in different directions, the sample as a whole is referred to as having a "random texture."

Pure tantalum is a Group Vb transition metal which typically crystallizes in a "body-centered cubic" matrix. As shown schematically in FIG. 1, each tantalum atom 10 in the body-centered cubic matrix (or, more accurately, in a "unit cell" 12 of the matrix) is typically surrounded by eight other equally spaced tantalum atoms 14. Two sets of directions relative to the crystalline matrix are specifically indicated on the unit cell 12 of FIG. 1: that indicated by the arrows 16 along "sides" of the unit cell 12 (referred to collectively as "<200> directions") and that indicated by the arrows 18 along "diagonals" of the unit cell 12 (referred to collectively as "<222> directions").

Since the unit cell 12 is symmetric along all three <200> directions, each of the <200> directions is physically equivalent to each of the other <200> directions . Likewise, each of the <222> directions is physically equivalent to each of the other <222> directions. Note that the atoms 10, 14 in the unit cell 12 are more closely packed along the <222> directions than along the <200> directions.

High purity tantalum is often melted using an electron-beam technique and then cast to form ingots or billets having random textures and grain sizes ranging to the order of several centimeters. One conventional method for fabricating tantalum targets uses side-forging and side-rolling to reduce the thicknesses of the billets along their centerlines, These processes typically induce grains which are elongated in the direction of the billet centerline. The resulting metal has either a random textures or a predominantly <200> textures, in which a majority of the grains are aligned so that one of their <200> directions is normal to the forging or rolling plane.

Alternatively upset forging and upset rolling have been used in the fabrication of tantalum sputtering targets. In these processes, one of the dimensions of the ingot is reduced while one or more of the other dimensions are allowed to increase.

In the past, the high purity tantalum metal used for the fabrication of sputter targets has been only lighty worked. Dimensional reductions of about 50% to about 80% are typical in conventional side-forging and side-rolling processes. Since the billets have not been heavily worked, the conventional processes have produced targets having large, non-uniform -rain sizes ranging from about 70 μm to about 300 μm. Since the metal is only lightly worked, high temperatures, on the order of 1500° C., are required to fully anneal the billets.

It has been found that targets with predominatly <222> texture have higher sputtering rates and deposit more uniform metallic films on substrates during conventional sputtering processes. Without wishing to be bound by any theory of operation, predominantly <222> texture is believed to produce better results due to the closer packing of the atoms along the <222> directions of the crystalline matrices. It has also been found that targets having smaller grain sizes tend to have have higher sputtering rates and to deposit more uniform metallic films.

Accordingly, there remains a need for a method for fabricating tantalum sputtering targets having predominantly <222> texture and small, uniform grain sizes on the order of 20–25 μm.

SUMMARY OF THE INVENTION

This need and others are addressed by a process which combines sideforging or rolling with upset forging or rolling to produce sputter targets having uniformly fine grain structures and predominantly <222> textures.

A process for treating substantially pure tantalum and fabricating a sputter target begins with providing a tantalum billet having a centerline. Next, the billet is plastically deformed, such as by side-forging or side-rolling, to reduce a first dimension of the billet transverse to the centerline, preferably by about 70% to about 85%. The billet is then upset, such as by upset forging or upset rolling, to reduce a second dimension of the billet transverse to the first dimension (for example, a second dimension lying parallel to the centerline), preferably by about 90% to about 99%. In accordance with an especially preferred process, the upsetting of the billet is followed by rolling along a plane normal to the second dimension.

Once the metal has been treated, the billet preferably is machined to separate the sputter target. Most preferably, the billet is machined so that the sputtering surface of the target corresponds with the forging or rolling plane of the last step in the treatment process. It has been found that billets prepared in accordance with the invention have predominantly <222> textures relative to the forging or rolling planes, so that a target machined in such a way that its sputtering surface corresponds with this plane will have the same predominant texture.

In accordance with another especially preferred process, the steps of plastically deforming and upsetting the billet are each carried out at a temperature ranging from about room temperature (typically about 25° C.) to about 400° C. In addition, each of these steps is followed by a vacuum anneal at a temperature of about 900° C. to about 1200° C. Since the tantalum billet is heavily worked during the plastic deformation and upset steps, the preferred process of the invention admits of significantly lower annealing temperatures than those required by the processes of the prior art, thereby reducing manufacturing costs.

It has been found that the combination of side-forging (or rolling) and upset forging (or rolling), both carried out with heavy drafts, produces billets having uniformly fine grain sizes (approximately 25 μm or less) and predominantly <222> textures with respect to the forging or rolling plane of the billet. These properties each contribute to improving the sputter rates of the targets formed from these billets and the uniformity of metallic films deposited by the targets on substrates during sputtering operations.

Therefore, it is an object of the invention to provide a a process which combines a side-forging or side-rolling-step with an upset forging or upset rolling step to produce a putter target of substantially pure tantalum having a body-centered cubic crystalline structure, predominantly <222> texture and grains no greater than about 25 μm. Other objects and advantages of the invention will be apparent from the following description, the accompanying drawings and the appended claims.

DETAILED DESCRIPTION OF THE PREFERRED EMBODIMENT

Figure 1:
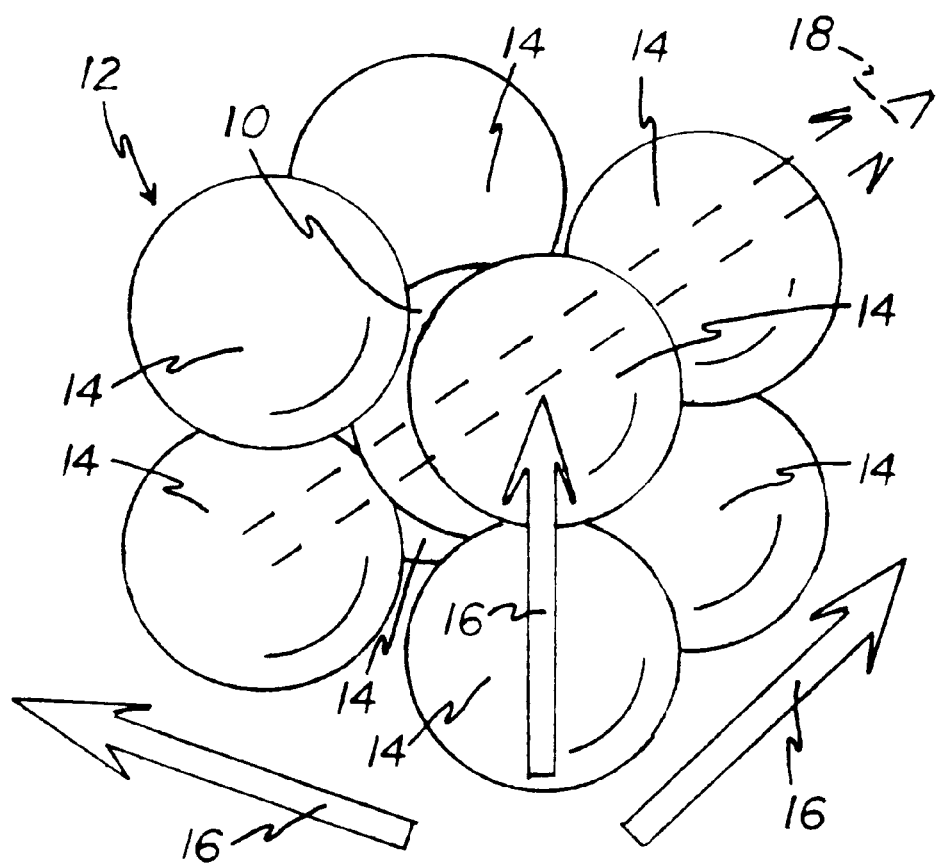
FIG. 1 is a schematic representation of a unit cell of a body-centered cubic crystalline matrix showing the <200> and <222> directions.
Figure 2:
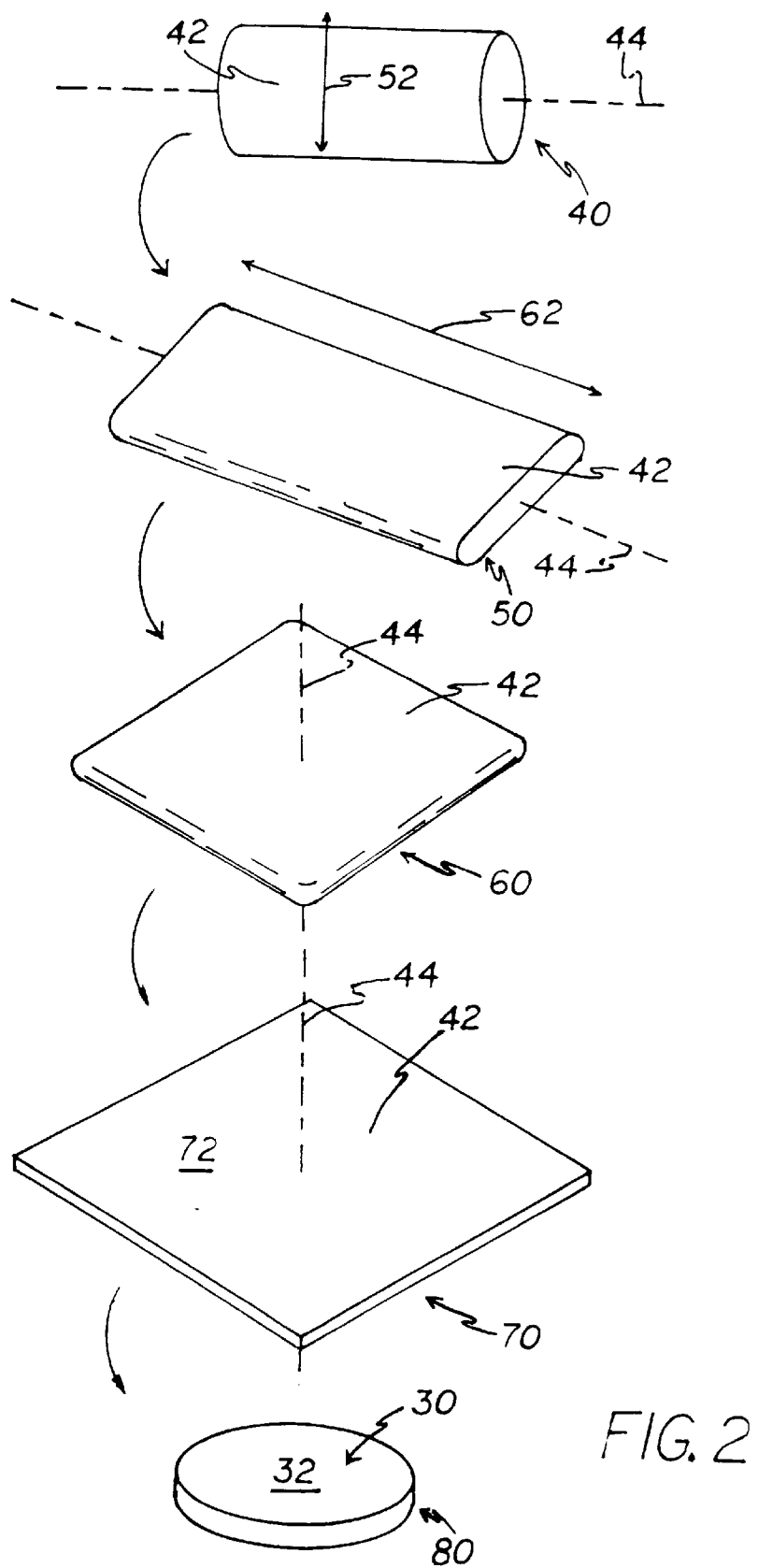
FIG. 2 is a schematic diagram setting forth a preferred process in accordance with the invention.

Referring to FIG. 2, an especially preferred process for fabricating a sputter target 30 having a sputtering surface 32 begins at step 40 with providing a billet 42 of substantially pure tantalum having a centerline 44. One method for forming, such a billet 42 includes melting the tantalum with an electron beam (not shown) and then casting the tantalum to form the billet 42. This technique is well known to those of ordinary skill in the art. While the billet 42 is shown as cylindrical or rod-shaped in FIG. 2, the precise shape of the billet is not critical to the present invention.

Next, at step 50, the billet 42 is side-forged or side-rolled at a temperature ranging from room temperature (typically about 25° C.) to about 400° C. to reduce a first dimension 52 of the billet 42 transverse (most preferably, substantially perpendicular) to the centerline 44 by about 70% to about 85%. This step 50 is followed by a vacuum anneal at a temperature of about 900° C. to about 1200° C. It should be noted that, due to the heavy working of the metal during the side-forging or side-rolling step, the approximately 900° C. to 1200° C. annealing temperature is lower than the annealing temperature typically used in connection with prior art processes, typically about 1500° C.

Next, at step 60, the billet 42 is upset forged or upset rolled at a temperature ranging from about room temperature to about 400° C. to reduce a second dimension 62 of the billet 42 transverse (most preferably, substantially perpendicular) to the first dimension 52 by about 90% to about 99%. In the example shown in FIG. 2, the second dimension 62 lies parallel to the centerline 44, though this is not required by the present invention. This step 60 is followed by another vacuum anneal at a temperature of about 900° C. to about 1200° C. Once again, it should be noted that the annealing temperature used in the process of the invention is lower than the annealing temperature typically used in connection with prior art processes.

The upsetting of the billet 42 is followed, at 70, by rolling along a rolling plane 72 normal to the second dimension 62 (that is, in the example shown, normal to the centerline 44) to reduce the thickness of the billet 42 to the desired thickness of the finished sputter target 30.

Finally, at 80, the billet 42 is machined to form the sputter target 30. Preferably, the billet 42 is machined so that the sputtering surface 32 of the sputter target 30 corresponds to the rolling plane 72.

According to another especially preferred process, the steps of plastically deforming and upsetting the billet are each carried out at a temperature ranging from about room temperature (that is, about 25° C.) to about 400° C. In addition, each of these steps is followed by a vacuum anneal at a temperature of about 900° C. to about 1200° C.

Figure 3:
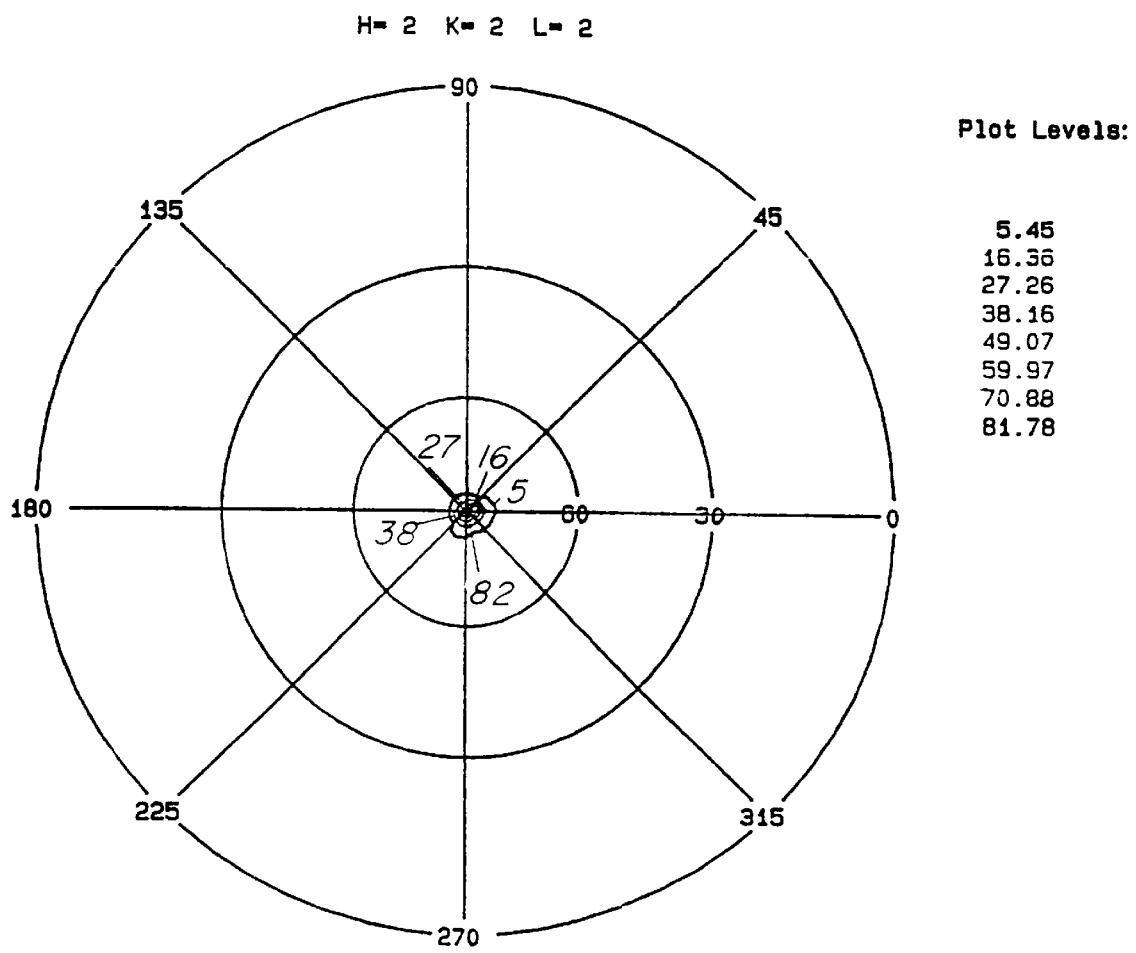
FIG. 3 is a polarograph showing the orientation distribution in a tantalum billet worked in accordance with the method of the invention.

It has been found that the combination of side-forging (or rolling) with upset forging (or rolling) of the billet, both carried out at relatively high reductions, produces billets having uniformly small grain sizes (approximately 25 μm or less) and predominantly <222> texture with respect to the forging or rolling plane of the billet. A sample billet worked in accordance with the invention showed a <222> texture approximately 82 times random distribution. A polarograph showing the orientation distribution in a billet worked in accordance with the invention is reproduced in FIG. 3. Thus, sputter targets so made having sputtering surfaces corresponding to the final forging or rolling planes of the billets have high sputtering rates and tend to deposit highly uniform films during sputtering.

In addition, since the billets are heavily worked during the process of the invention, they may be annealed at lower temperatures than tantalum billets worked by conventional processes.

While the methods herein described, and the products produced by these methods constitute preferred embodiments of this invention, it is to be understood that the invention is not limited to these precise methods and products, and that changes may be made in either without departing from the scope of the invention which is defined in the appended claims.

What is claimed is:

1. A process for working substantially pure tantalum to form a sputter target having predominantly <222> texture and uniform grain sizes of about 20–25 μm, said process comprising the steps of:

a) providing a billet of substantially pure tantalum having a centerline;

b) plastically deforming said billet to reduce a first dimension of said billet normal to said centerline, and c) upsetting said billet from said step b) to reduce a second dimension of said billet normal to said first dimension.

2. The process as recited in claim 1 wherein said step a) includes casting said substantially pure tantalum to form said billet.

3. The process as recited in claim 1 wherein said step b) includes side-forging said billet.

4. The process as recited in claim 1 wherein said step b) includes plastically deforming said billet at a temperature of about 25° C. to about 400° C.

5. The process as recited in claim 1 wherein said step b) includes plastically deforming said billet to reduce a cross-sectional area of said billet parallel to said first dimension by about 70% to about 85%.

6. The process as recited in claim 1 including the additional step of vacuum annealing said billet after said step b) at a temperature of about 900° C. to about 1200° C.

7. The process as recited in claim 1 wherein said step c) includes upset forging said billet.

8. The process as recited in claim 1 wherein said second dimension is parallel to said centerline.

9. The process as recited in claim 1 wherein said step c) includes upsetting said billet at a temperature of about 25° C. to about 400° C.

10. The process as recited in claim 1 wherein said step c) includes upsetting said billet to reduce said second dimension of said billet by about 90% to about 99%.

11. The process as recited in claim 1 including the additional step of vacuum annealing said billet after said step c) at a temperature of about 900° C. to about 1200° C.

12. The process as recited in claim 1 including the additional step of machining said billet from said step c) to form said sputter target.

13. A process for fabricating a sputter target having predominantly <222> texture and uniform grain sizes of about 20–25 μm, from a billet of substantially pure tantalum, said process including the steps of:

a) providing a billet of substantially pure tantalum having a centerline;

b) plastically deforming said billet at a temperature of about 25° C. to about 400° C. to reduce a first dimension of said billet normal to said centerline by about 70% to about 85%; and c) upsetting said billet from said step b) at a temperature of about 25° C. to about 400° C. to reduce a second dimension of said billet normal to said first dimension by about 90% to about 99%.

14. The process as recited in claim 13 wherein said step a) includes casting said substantially pure tantalum to form said billet.

15. The process as recited in claim 13 wherein said step b) includes side-forging said billet.

16. The process as recited in claim 13 including the additional step of vacuum annealing said billet after said step b) at a temperature of about 900° C. to about 1200° C.

17. The process as recited in claim 13 wherein said step c) includes upset forging said billet.

18. The process as recited in claim 13 including the additional step of vacuum annealing said billet after said step c) at a temperature of about 900° C. to about 1200° C.

19. The method as recited in claim 1 including the additional step after said step c) of rolling, said billet alone a plane normal to said second dimension.

20. A process for fabricating a sputter target having predominantly <222> texture and uniform grain sizes of about 20–25 μm, from a billet of substantially pure tantalum, said process including the steps of:

a) providing a billet of substantially pure tantalum having a centerline;

b) plastically deforming said billet at a temperature of about 25° C. to about 400° C. by a method selected from the group consisting of side-forging and side-rolling, to reduce a first dimension of said billet normal to said centerline by about 70% to about 85%;

c) vacuum annealing said billet from said step b) at a temperature of about 900° C. to about 1200° C.;

d) upsetting said billet from said step c) at a temperature of about 25° C. to about 400° C. by a method selected from the group consisting of upset forging and upset rolling, to reduce a second dimension of said billet normal to said first dimension by about 90% to about 99%;

e) vacuum annealing said billet from said step d) at a temperature of about 900° C. to about 1200° C.; and f) machining said billet from said step e) to form said sputter target.

21. The process as recited in claim 20 including the additional step of casting said substantially pure metal to form said billet.

22. The process as recited in claim 20 including the additional step of rolling said billet along a plane normal to said second dimension, after said step e) and prior to said step f).

23. A process for working substantially pure tantalum to form a sputter target having predominantly <222> texture and uniform grain sizes of about 20–25 μm, said process comprising the steps of:

a) provding a billet of substantially pure tantalum having a centerline;

b) plastically deforming said billet so as to reduce a first dimension of said billet normal to said centerline; and c) upsetting said billet from said step b) to reduce a second dimension of said billet normal to said first dimension, said step (b) comprising side-rolling said billet.

24. A process for working substantially pure tantalum to form a sputter target having predominantly <222> texture and uniform grain sizes of about 20–25 μm, said process comprising the steps of:

a) providing a billet of substantially pure tantalum having a centerline;

b) plastically deforming, said billet so as to reduce a first dimension of said billet normal to said centerline; and c) upsetting said billet from said step b) to reduce a second dimension of said billet normal to said first dimension, said step c) comprising upset rolling said billet.

25. A process for working substantially pure tantalum to form a sputter target having predominantly <222> texture and uniform grain sizes of about 20–25 μm, said process comprising the steps of:

a) providing a billet of substantially pure tantalum having a centerline;

b) plastically deforming said billet so as to reduce a first dimension of said billet normal to said centerline;

c) upsetting said billet from said step b) to reduce a second dimension of said billet normal to said first dimension; and d) rolling said billet from said step c) along a plane normal to said second dimension.

26. A process for fabricating a sputter target having a predominantly <222> texture and uniform grain sizes of about 20–25 μm from a billet of substantially pure tantalum, said process including the steps of:

a) providing a billet of substantially pure tantalum having a centerline;
b) plastically deforming said billet at a temperature of about 25° C. to about 400° C. to reduce a first dimension of said billet normal to said centerline by about 70% to about 85%; and
c) upsetting said billet from said step b) at a temperature of about 25° C. to about 400° C. to reduce a second dimension of said billet normal to said first dimension by about 90% to about 99% said step b) including side rolling said billet.

27. A process for fabricating a sputter target having a predominantly <222> texture and uniform grain sizes of about 20–25 μm from a billet of substantially pure tantalum, said process including the steps of:

a) providing a billet of substantially pure tantalum having a centerline;
b) plastically deforming said billet at a temperature of about 25° C. to about 400° C. to reduce a first dimension of said billet normal to said centerline by about 70% to about 85%; and
c) upsetting said billet from said step b) at a temperature of about 25° C. to about 400° C. to reduce a second dimension of said billet normal to said first dimension by about 90% to about 99%, said step c) including upset rolling said billet.

28. A process for fabricating a sputter target having a predominantly <222> texture and uniform grain sizes of about 20–25 μm from a billet of substantially pure tantalum, said process including the steps of:

a) providing a billet of substantially pure tantalum having a centerline;
b) plastically deforming said billet at a temperature of about 25° C. to about 400° C. to reduce a first dimension of said billet normal to said centerline by about 70% to about 85%; and
c) upsetting said billet from said step b) at a temperature of about 25° C. to about 400° C. to reduce a second dimension of said billet normal to said first dimension by about 90 to about 99%; and
d) rolling said billet from said step c) along a plane normal to said second dimension.

29. A process for fabricating a sputter target of substantially pure tantalum having a predominantly <222> texture and uniform grain sizes of about 20–25 μm from a billet of substantially pure tantalum, said process including the steps of:

a) providing a billet of substantially pure tantalum having a centerline;
b) plastically deforming said billet at a temperature of about 20–25 ° C. to about 400° C. by a method selected from the group consisting of side-forging and side-rolling, to reduce a first dimension of said billet normal to said centerline by about 70% to about 85%;
c) vacuum annealing said billet from said step b) at a temperature of about 900° C. to about 1200° C.;
d) upsetting said billet from said step c) at a temperature of about 25° C. to about 400° C. by a method selected from the group consisting of upset forging and upset rolling, to reduce a second dimension of said billet normal to said first dimension by about 90% to about 99%;
e) vacuum annealing said billet from said step d) at a temperature of about 900° C. to about 1200° C.; and
f) rolling said billet from said step e) along a plane normal to said second dimension.

* * * * *